(12) United States Patent  
Benkert et al.

(10) Patent No.: US 9,112,152 B2
(45) Date of Patent: Aug. 18, 2015

(54) METHOD FOR PRODUCING A PIEZO ACTUATOR AND PIEZO ACTUATOR

(75) Inventors: Katrin Benkert, München (DE); Hermann Bödinger, München (DE); Stefan Denneler, München (DE); Harald Johannes Kastl, Fichtelberg (DE); Andreas Lenk, Bannewitz Ot Possendorf (DE); Carsten Schuh, Baldham (DE)

(73) Assignee: CONTINENTAL AUTOMOTIVE GMBH, Hannover (DE)

( * ) Notice: Subject to any disclaimer, the term of this patent is extended or adjusted under 35 U.S.C. 154(b) by 230 days.

(21) Appl. No.: 13/702,128

(22) PCT Filed: Jun. 6, 2011

(86) PCT No.: PCT/EP2011/059285
§ 371 (c)(1),
(2), (4) Date: Jan. 24, 2013

(87) PCT Pub. No.: WO2011/154352
PCT Pub. Date: Dec. 15, 2011

(65) Prior Publication Data
US 2013/0127302 A1 May 23, 2013

(30) Foreign Application Priority Data

Jun. 7, 2010 (DE) .......................... 10 2010 022 911

(51) Int. Cl.
*H01L 41/273* (2013.01)
*H01L 41/293* (2013.01)
*H01L 41/083* (2006.01)
*H01L 41/27* (2013.01)

(52) U.S. Cl.
CPC ............ *H01L 41/273* (2013.01); *H01L 41/083* (2013.01); *H01L 41/27* (2013.01); *H01L 41/293* (2013.01); *Y10T 29/42* (2015.01)

(58) Field of Classification Search
CPC ... H01L 41/083; H01L 41/273; H01L 41/293; H01L 41/297; H01L 41/33; H01L 41/339; Y10T 29/42
See application file for complete search history.

(56) References Cited

U.S. PATENT DOCUMENTS 5,254,212 A 10/1993 Someji et al. .................... 216/20
7,061,162 B2 * 6/2006 Sato et al. ...................... 310/328
(Continued)

FOREIGN PATENT DOCUMENTS

DE 10260853 A1 7/2004 ............ H01L 41/083
DE 102004012033 A1 10/2004 ............ F02M 51/00
(Continued)

OTHER PUBLICATIONS

German Office Action, Application No. 10 2010 022 911, 3 pages, Feb. 10, 2011.
(Continued)

*Primary Examiner* — Livius R Cazan
(74) *Attorney, Agent, or Firm* — Slayden Grubert Beard PLLC

(57) ABSTRACT

A method for producing a piezo actuator includes: providing a green stack including alternately successive green films and inner electrode layers; forming trenches on the outside green stack in areas in which the inner electrode layers are intended to be electrically insulated from the corresponding outer electrodes, the trenches shortening the inner electrode layers from the outside of the green stack toward the inside; filling the trenches with an electrically insulating slurry; further processing the green stack, including filling the trenches with slurry, such that the green films produce piezo electric layers and the green stack produces a piezo stack; mounting two outer electrodes on the outside of the piezo stack, such that the two outer electrodes are alternately electrically connected to the inner electrode layers. The trenches may be filled with the slurry using one of the following methods; screen printing, immersion, spraying, or vacuum infiltration.

15 Claims, 2 Drawing Sheets

(56) References Cited

U.S. PATENT DOCUMENTS

| | | |
|---|---|---|
| 7,598,660 B2 | 10/2009 | Kobayashi et al. ............ 310/366 |
| 7,851,978 B2 | 12/2010 | Bayer et al. .................... 310/340 |
| 7,905,000 B2 | 3/2011 | Ganster et al. ................ 29/25.35 |
| 7,982,373 B2 | 7/2011 | Doellgast et al. ............. 310/366 |
| 8,264,125 B2 | 9/2012 | Denzler et al. ................ 310/328 |
| 2009/0000092 A1 | 1/2009 | Sugg ............................. 29/25.35 |
| 2009/0320255 A1* | 12/2009 | Ganster et al. ................ 29/25.35 |
| 2013/0127302 A1 | 5/2013 | Benkert et al. ................ 310/366 |

FOREIGN PATENT DOCUMENTS

| | | | |
|---|---|---|---|
| DE | 102006011293 A1 * | 9/2007 | |
| DE | 102006019489 B4 | 3/2008 | ............ H01L 41/053 |
| DE | 102006025172 B4 | 10/2008 | ............. F02M 51/06 |
| DE | 102007037500 A1 | 11/2008 | ............. H01L 41/083 |
| EP | 0766325 A1 | 4/1997 | ............... C04B 35/49 |
| JP | 2005216997 A | 8/2005 | ................ H01G 4/30 |
| JP | 2006066878 A | 3/2006 | ............. F02M 51/06 |
| WO | 2006/087871 A1 | 8/2006 | ............ H01L 41/083 |
| WO | 2008/092740 A2 | 8/2008 | ............ H01L 41/083 |
| WO | 2008/119702 A1 | 10/2008 | ............ H01L 41/083 |
| WO | 2011/154352 A1 | 12/2011 | ............ H01L 41/083 |

OTHER PUBLICATIONS

International Search Report and Written Opinion, Application No. PCT/EP2011/059285, 20 pages, Aug. 8, 2011.

* cited by examiner

METHOD FOR PRODUCING A PIEZO ACTUATOR AND PIEZO ACTUATOR

CROSS-REFERENCE TO RELATED APPLICATIONS

This application is a U.S. National Stage Application of International Application No. PCT/EP2011/059285 filed Jun. 6, 2011, which designates the United States of America, and claims priority to DE Application No. 10 2010 022 911.3 filed Jun. 7, 2010, the contents of which are hereby incorporated by reference in their entirety.

TECHNICAL FIELD

The disclosure relates to a method for producing a piezo actuator and to a piezo actuator.

BACKGROUND

A component made of piezo elements stacked one above another is designated a (piezo) stack. The function of a piezo element is based on the deformation of a piezo-ceramic material, such as lead-zirconate-titanate, and the action of an electric field. If an electric voltage is applied to a piezo element, then the latter expands in the direction perpendicular to the electric field generated by the electric voltage. A single piezo element has a relatively small actuating travel, for which reason, for a larger actuating travel, use is made of a piezo stack made of a plurality of piezo-electric layers following one another alternately and what are known as inner electrode layers.

The inner electrode layers are normally alternately connected electrically to outer electrodes arranged on opposite outer surfaces of the piezo stack. The inner electrode layers, which are electrically connected to one of the two outer electrodes, are therefore led as far as the outer side on which this outer electrode is arranged for the electrical connection to the outer electrode. In order that the inner electrode layers are insulated electrically from the other outer electrode, the inner electrode layers do not reach as far as the outer side of the piezo stack on which the further outer electrode is arranged. In these areas, the inner electrode layers are set back from the outer side. This is achieved, for example, in that the piezo stack in these areas is provided with slots filled with silicone resin, plastic or varnish.

As a result of the set-back inner electrode layers, the result in the piezo-electric layers associated with these areas is what are known as inactive zones, which, when an electric voltage is applied to the outer electrode layers and inner electrode layers, are penetrated by a reduced electric field strength and therefore, when an electric voltage is applied, expand less highly than the other active zones, as they are known, of the piezo-electric layers. This leads to mechanical stresses, in particular in the inactive zones and the edge regions associated with the inactive zones, and can lead to what are known as poling cracks in the inactive and active zones of the piezo-electric layers and in the outer electrodes. The danger of poling cracks is therefore all the greater, the larger the inactive zones.

In order to be able to provide a piezo actuator with a piezo stack in which the smallest possible inactive zones are formed, DE 10 2006 011 293 A1 proposes a method which is based on further processing a fully active green stack.

A fully active green stack (or fully active piezo stack) designates a green stack (piezo stack) formed from a plurality of green films (piezo-electric layers) and electrically conductive layers arranged between the former, in which the electrically conductive layers form the inner electrode layers of the stack and are formed continuously as far as the outer sides of the stack. Such a fully active green stack (piezo stack) accordingly has no inactive zones but only active zones, i.e. a green film (piezo-electric layer) arranged between two inner electrode layers and belonging to the fully active green stack (piezo stack) is completely covered on one side thereof by the one inner electrode layer and on the other side thereof by the other inner electrode layer. One advantage of such a fully active piezo stack is its relatively simple production using known process steps.

The inner electrode layers are provided to be connected electrically alternately to outer electrodes to be arranged on the outer side of a piezo stack produced from the green stack. However, in order that the inner electrode layers are electrically connected only to the outer electrode provided therefor and remain electrically insulated from the other outer electrode, the areas of the outer side on which the further outer electrode is later arranged are provided with trenches. By means of the trenches, the inner electrode layers in these areas are set back from the respective outer side of the fully active green stack, which means that extremely small inactive zones are produced in these areas. In order that, during the later application of the outer electrodes, the inner electrode layers are also electrically connected only to the outer electrode provided, the trenches are filled with the electrically insulating slurry, a liquid mixture of ceramic powder and binders, before the application of the outer electrodes.

With the method proposed in DE 10 2006 011 293 A1, the trenches and thus the inactive zones of the piezo stack provided with the trenches can be dimensioned such that they are no larger than is absolutely necessary for good electrical insulation of the inner electrode layers with respect to the corresponding outer electrode. As a result, the inactive zones of this piezo stack can be designed to be as small as possible, which means that the danger of producing poling cracks is reduced.

In order to produce the trenches, DE 10 2006 011 293 A1 proposes using a laser. One disadvantage of this procedure is that, as a result of lasering the trenches, the organics in the green stack burn in these areas. In the process, the ceramic can be partly broken down, forming refractory primary oxides such as $ZrO_2$ and $TiO_2$. The material burned away must subsequently be removed completely from the trenches in order to provide pore-free and crack-free filling of the trenches. This is possible only with considerable effort, the danger of damaging the piezo stack at the same time being high.

In order to introduce the slurry into the trenches, DE 10 2006 011 293 A1 likewise proposes falling back on the laser method used to create the trenches. One disadvantage of this procedure is that the method is relatively time-consuming and costly, since the production of the trenches by the laser has to be carried out sequentially.

SUMMARY

In one embodiment, a method is provided for producing a piezo actuator with a piezo stack and two outer electrodes arranged on the outer side of the piezo stack, the method comprising the steps: providing a fully active green stack comprising a plurality of alternately successive green films and continuous inner electrode layers, which are provided for the purpose of alternately being connected electrically to one of the two outer electrodes to be arranged on the outer side of the piezo stack which is to be produced from the green stack and being insulated electrically from the respective other outer electrode; providing the outer side of the fully active green stack with trenches in areas in which the inner electrode layers are intended to be insulated electrically from the corresponding outer electrodes, so that the trenches shorten the inner electrode layers in these areas from the outer side of the green stack to the inside; filling the trenches with an electrically insulating slurry; further processing the green stack, the trenches of which are filled with the slurry, so that the green films become piezo-electric layers and the green stack becomes the piezo stack; and applying the two outer electrodes to the outer side of the piezo stack, so that the two outer electrodes are alternately connected electrically to the inner electrode layers, wherein the trenches are filled with the slurry using one of the following methods: screen printing, immersion, spraying or vacuum infiltration.

In a further embodiment, in addition to filling the trenches with the slurry, the surface of the piezo stack is covered with the slurry in order to form a passivation layer with the slurry. In a further embodiment, the filling of the trenches and the application of the passivation layer to the surface of the piezo stack with the slurry are carried out in a common processing step. In a further embodiment, the outer side of the fully active green stack is provided with trenches by hot embossing. In a further embodiment, a stamp having a number and arrangement of protrusions corresponding to the number and arrangement of the trenches to be produced is used. In a further embodiment, the compaction behavior of the ceramic particles in the slurry is matched to the compaction behavior of the piezo stack. In a further embodiment, an agent influencing the shrinkage behavior of the slurry is added thereto during a thermal treatment. In a further embodiment, Ag, AgO or PbO is used as an agent influencing the shrinkage behavior of the slurry. In a further embodiment, the agent influencing the shrinkage behavior of the slurry assumes 0.05 to 1.00% by weight of the slurry. In a further embodiment, the sintering activity of the ceramic particles in the slurry is enhanced by a reduction in the grain or primary particle sizes. In a further embodiment, the green stack, the trenches of which are filled with the slurry, is placed under pressure in a liquid bath, in order to compress the slurry arranged in the trenches. In a further embodiment, the filling of the trenches with the slurry is carried out in a plurality of steps.

In another embodiment, a piezo actuator having a piezo stack and two outer electrodes arranged on the outer side of the piezo stack is produced in accordance with any of the disclosed techniques.

BRIEF DESCRIPTION OF THE DRAWINGS

Example embodiments will be explained in more detail below with reference to figures, in which.

DETAILED DESCRIPTION

Figure 1:
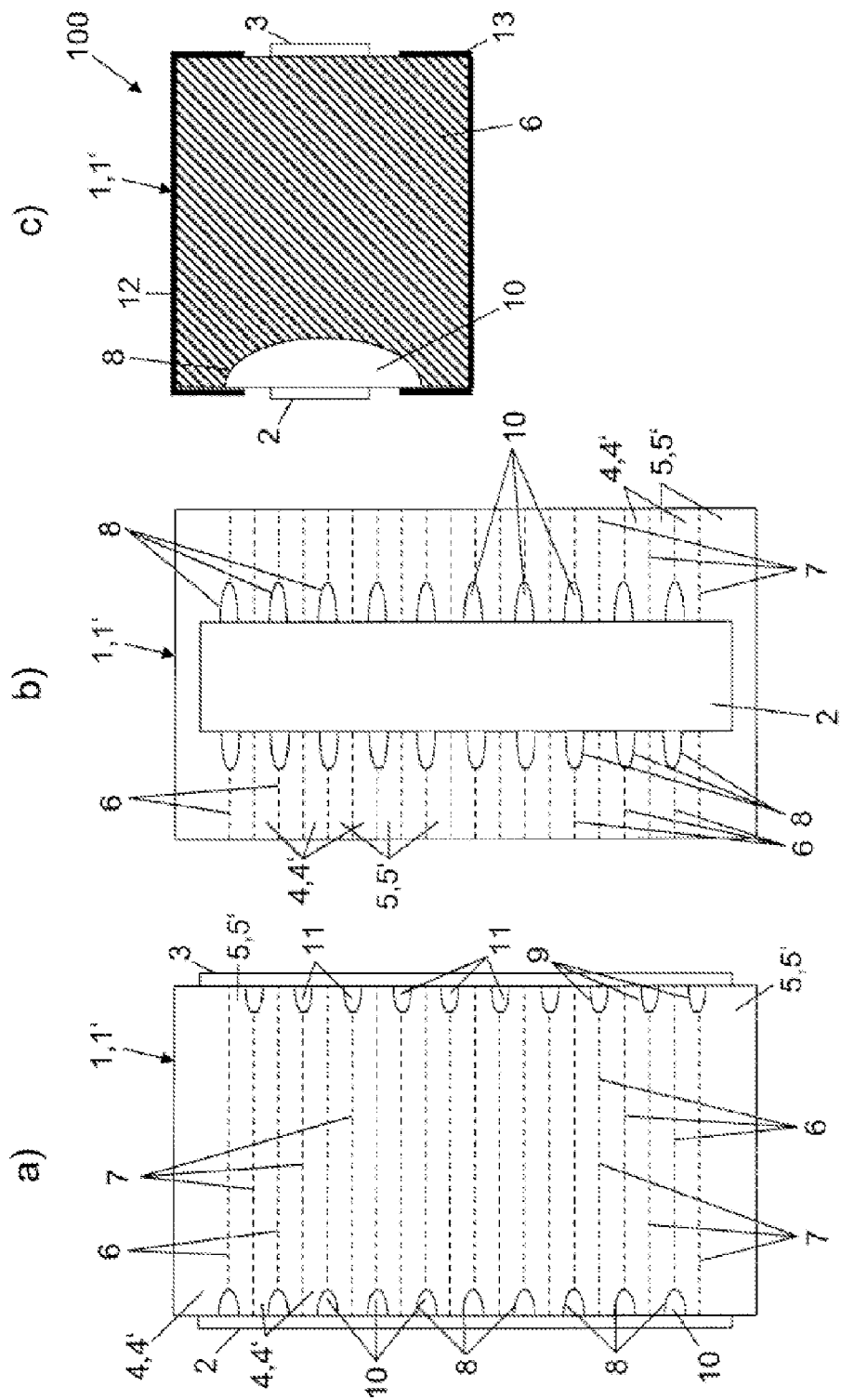
FIGS. 1a) and 1b) show a piezo actuator according to a first exemplary embodiment, in each case in a sectioned side view, FIG. 1c) shows the piezo actuator of FIGS. 1a) and 1b) in a sectioned plan view, FIGS. 2a) and 2b) show a piezo actuator according to a second exemplary embodiment, in each case in a sectioned side view, and FIG. 2c) shows the piezo actuator of FIGS. 2a) and 2b) in a sectioned plan view.

Some embodiments provide a method with which a piezo actuator having a piezo stack with the smallest possible inactive zones can be produced in a simpler way. Other embodiments provide a piezo actuator produced by such method.

For example, a method for producing a piezo actuator with a piezo stack and two outer electrodes arranged on the outer side of the piezo stack may be based on the method described in DE 10 2006 011 293 A1, and may comprise the following steps: providing a fully active green stack comprising a plurality of alternately successive green films and continuous inner electrode layers, which are provided for the purpose of alternately being connected electrically to two outer electrodes to be arranged on the outer side of the piezo stack which is to be produced from the green stack and being insulated electrically from the respective other outer electrode. Providing the outer side of the fully active green stack with trenches in areas in which the inner electrode layers are intended to be insulated electrically from the corresponding outer electrodes, so that the trenches shorten the inner electrode layers in these areas from the outer side of the green stack to the inside. Filling the trenches with an electrically insulating slurry. Further processing the green stack, the trenches of which are filled with the slurry, so that the green films become piezo-electric layers and the green stack becomes the piezo stack. Applying the two outer electrodes to the outer side of the piezo stack, so that the two outer electrodes are alternately connected electrically to the inner electrode layers. According to some embodiments, the trenches are filled with the slurry using one of the following methods: screen printing, immersion, spraying or vacuum infiltration.

The disclosed methods for filling the trenches with slurry may have the advantage that the slurry can be applied in a simple and uniform manner to the green stack provided with the trenches in a simple manner. A further advantage is that a high level of homogeneity can be achieved when filling the trenches with the electrically insulating slurry. This applies in particular during the use of a screen printing method, in which the quantity of slurry which is intended to be introduced into the trenches can be fixed in a defined way.

As a result of filling the trenches with ceramic slurry, very small inactive areas are produced in a fully active piezo-electric component. These areas can be dimensioned such that they are no larger than is absolutely necessary for good electrical insulation of the inner electrode layers with respect to the corresponding outer electrode. The danger of producing poling cracks can be reduced in this way.

In one embodiment, in addition to filling the trenches with slurry, the surface of the piezo stack is covered with the slurry in order to form a passivation layer with the slurry. In this way, the otherwise additionally necessary step of applying a passivation layer can be dispensed with. With the disclosed method for applying the slurry, it may be ensured that the layer thickness of the passivation layer can be applied uniformly. If the slurry is applied by a screen printing method, then the green stack is rotated, for example in a machine tool, until all the surface sides to be machined have been covered with the slurry and passivated.

In particular, provision is made for the filling of the trenches and the application of the passivation layer to the surface of the piezo stack with the slurry to be carried out in a common processing step.

Following the filling of the trenches and optionally the application of the slurry to the surface of piezo stack, the green stack is subjected in a known way to the process steps of debinding and sintering, so that piezo-electric layers are produced from the green films. The debinding and sintering then produce from the quasi-fully active green stack a quasi-fully active piezo stack which, following the mechanical machining (e.g. by grinding) of the sides having the trenches, can subsequently be provided with the outer electrodes.

According to a further embodiment, the outer side of the fully active green stack is provided with trenches by hot embossing. While, as a result of lasering the trenches, the organics in the green stack burn at these points on account of excessively high temperatures, which means that the ceramic can partly be broken down, forming refractory primary oxides, the trenches can be produced by using the hot embossing method at substantially lower temperatures as compared therewith. The trenches can be introduced into the green stack without forming burnt-up material. Since the trenches are introduced into the green stack, as compared with the introduction into an already sintered piezo stack, improved optical detection of the electrodes is provided. In the case of a green stack, the dimensions before the sintering process step are about 20% larger than after this thermal processing step.

For the hot embossing method, a stamp having a number and arrangement of protrusions corresponding to the number and arrangement of the trenches to be produced can be used. The spacing of the protrusions corresponds to the distance between each second inner electrode of the stack. In particular, by using such a stamp, it is possible to produce all the trenches of one outer side of the piezo stack in a single method step.

According to a further embodiment, the compaction behavior of the ceramic particles in the slurry is matched to the compaction behavior of the piezo stack. This procedure is based on the thought that the ceramic of the green stack compacts at lower temperatures than the ceramic slurry in the trenches during the sintering process step. The reason for this is, firstly, that the green stack has already been pre-compacted as a result of lamination of the green films arranged one above another and therefore has a higher green density. Secondly, the diffusion of silver in the electrodes consisting of AgPd promotes compaction at lower temperatures. The different compaction behavior during the sintering can lead to the formation of cracks in the area of the trenches. In the worst possible case, short-circuits in the piezo stack with which contact has been made can be caused as a result. In order to avoid this crack formation, provision is made to match the shrinkage behavior of the ceramic particles in the slurry to the shrinkage behavior of the piezo stack which results from the respective compaction of the ceramic components.

In a first variant, an agent influencing the shrinkage behavior of the slurry is added thereto during a thermal treatment (sintering) for this purpose. Ag, AgO or PbO can be used as an agent influencing the shrinkage behavior of the slurry. The agent influencing the shrinkage behavior of the slurry assumes in particular 0.05 to 1.00 percent by weight of the slurry, so that it is possible to speak of "doping" the ceramic powder.

In a second variant, the sintering activity of the ceramic particles in the slurry can be enhanced by a reduction in the grain or primary particle sizes.

In a third variant, the green stack, the trenches of which are filled with the slurry (without any agent influencing the shrinkage behavior), is placed under pressure in a liquid bath, in order to compress the slurry arranged in the trenches. Here, the process may be managed in such a way that isostatic compression of the ceramic slurry takes place and an approximately identical green density in relation to the green films arranged one above another (i.e. the green stack) is achieved. As a result of this procedure, subsequent compaction of the slurry in the trenches is thus carried out.

These alternatives listed above can also be combined with one another (as desired) in order to match the shrinkage behavior of the slurry in the trenches to the shrinkage behavior of the green stack.

According to a further embodiment, the filling of the trenches with the slurry is carried out in a plurality of steps, which achieves a flat surface of the green stack in the area of the outer electrodes to be applied.

Other embodiments provide a piezo actuator with a piezo stack and two outer electrodes arranged on the outer side of the piezo stack, which is produced according to the disclosed method.

Figure 2:
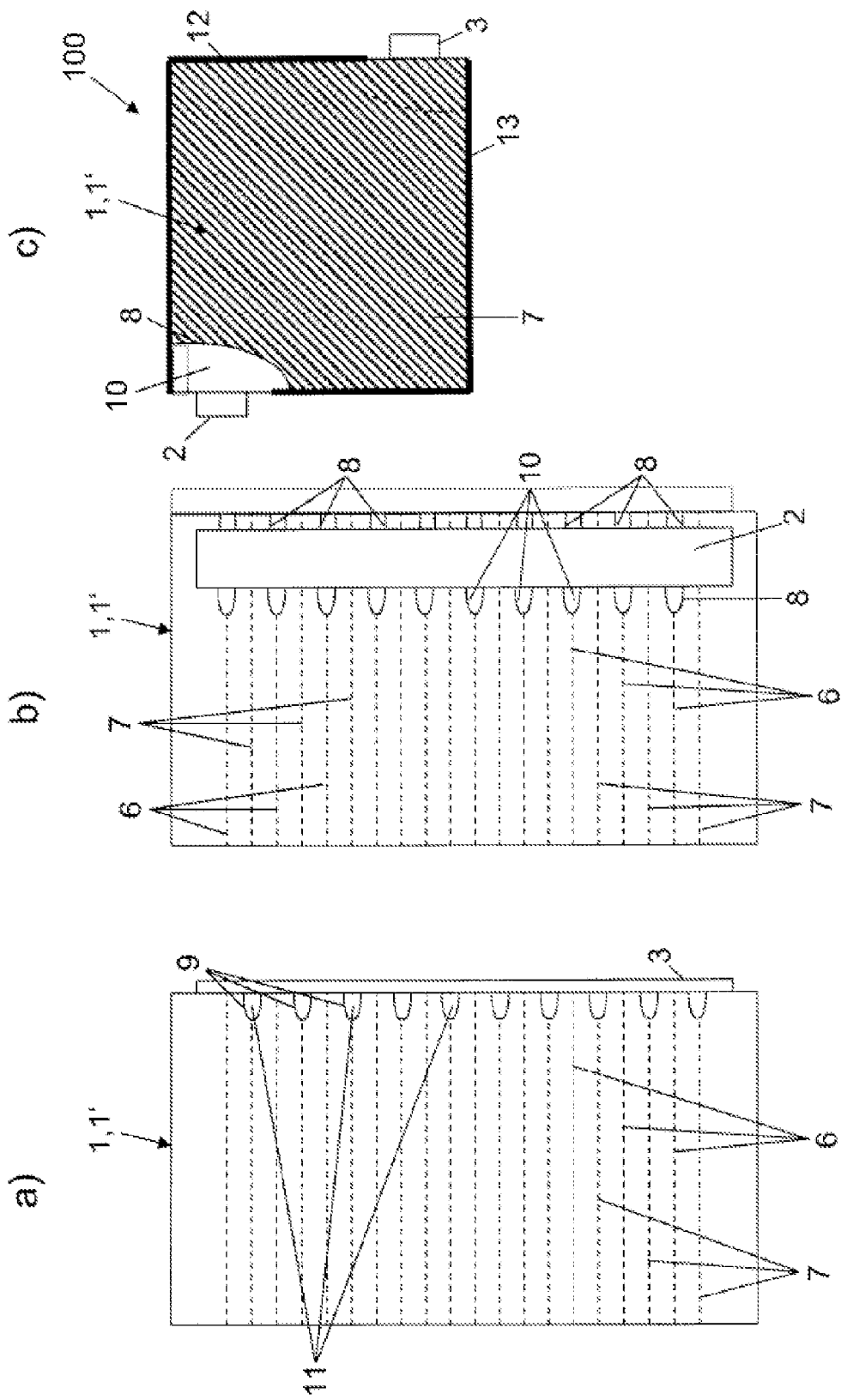

The starting point for the piezo actuators 100 illustrated in FIGS. 1 and 2 in the case of the present exemplary embodiments is a fully active green stack 1', in each case implemented in the shape of a box in plan view, which has a plurality of green films 4', 5' and inner electrode layers 6, 7 arranged between the former (cf. FIGS. 1*c*) and 2*c*)). The green stack 1' is produced in a generally known manner by the alternate stacking of an inner electrode layer and a green film. The green films 4', 5' comprise a piezo-ceramic material, for example lead-zirconate-titanate. The inner electrode layers 6, 7 are, for example, electrically conductive metal layers which pass continuously through the green stack 1', that is to say are formed continuously as far as the outer sides of the green stack 1', so that the green stack 1' initially has no inactive zones, instead only active zones. For this purpose, the inner electrode layers 6, 7 are alternately connected electrically to two outer electrodes 2, 3 to be arranged on the outer side of a piezo stack 1 to be produced from the green stack 1', and are electrically insulated from the respective other outer electrodes 3, 2.

To produce the piezo actuator 100, trenches 8, 9 are provided on at least one outer side of the green stack 1', so that a stack having inactive zones is produced from the fully active green stack 1'. In the two exemplary embodiments illustrated in FIGS. 1 and 2, the trenches 8, 9 are provided on opposite outer sides of the green stack 1'. While in the exemplary embodiment of FIG. 1 the respective trenches are arranged centrally with respect to the outer side thereof (cf. in particular the sectional illustration of FIG. 1*c*)), the trenches 8, 9 in the exemplary embodiment shown in FIG. 2 are arranged in the area of diagonally opposite side edges of the opposite outer surfaces (cf. FIG. 2*c*)).

A respective outer side of the green stack 1' is provided with the trenches 8 and 9, respectively, in such a way that each inner electrode 6 is set back into the interior of the green stack 1' by the trenches 8, and the remaining inner electrodes 7 remain led completely up to the relevant outer side. In a corresponding way, the trenches 9 on the other outer side are implemented in such a way that in each case the inner electrodes 7 are set back into the interior of the green stack 1', while the inner electrodes 6 are led up to this outer side. In the case of the exemplary embodiments shown in FIGS. 1 and 2, the trenches 8 are thus assigned to the inner electrodes 6, and the trenches 9 are assigned to the inner electrodes 7.

In the case of the present exemplary embodiments, the trenches 8, 9 may be produced by hot embossing. To this end, the green stack 1' has pressure applied to the relevant outer side by a stamp at elevated temperature (T>$T_g$ glass transition temperature of the polymer binder in the green stack, typically 20-200° C.). The stamp has a number and arrangement of protrusions that corresponds to the number and arrangement of the trenches 8, 9 to be produced, by which means the green stack 1' is deformed in the area of the protrusions in order to form the trenches. The spacing of the protrusions corresponds to that of the spacings of the inner electrode layers 6 and 7, respectively. With the aid of the hot embossing method, the trenches can be introduced into the green stack 1' at a temperature and pressure (only slightly increased as compared with lasering). The trenches are introduced without forming any burnt-off material. The use of the hot embossing method in the present green stack 1' permits improved optical detection of the electrodes on account of the larger dimensions of the green stack 1' as compared with the already sintered piezo stack 1, so that the method can be carried out in a simple and reliable way.

Alternatively, the introduction of the trenches could also be carried out using laser removal, sawing with (multiple) circular saw blades, micro-milling, reaming, ultrasonic erosion and water, sand or $CO_2$ jets.

The trenches 8, 9 are then filled with electrically insulating ceramic slurry 10 and 11. The filling of the trenches 8, 9 with the slurry 10, 11 may be carried out by screen printing, immersion, spraying or vacuum infiltration. The surface of the green stack 1' may be covered with the slurry at the same time in order to form a passivation layer. The use of a ceramic slurry as filling material for the trenches permits the production of a piezo actuator 100 with a homogeneous piezo stack 1 in which no dividing lines are produced between the slurry-filled trenches and green films 4', 5' after the sintering. In this way, poling cracks can be avoided.

The application of the slurry by a screen printing method may be preferable, since in this way homogenous layer thicknesses can be achieved both with respect to the trenches 8, 9 filled with slurry and also to the passivation layers 12, 13. To this end, the green stack 1' to be processed is rotated appropriately in a machine tool, so that the screen printing can be implemented on all the outer sides of the stack.

Following the introduction of the slurry 10, 11 into the trenches 8, 9, and the optional production of the passivation layers 12, 13, the process steps comprising debinding, sintering and mechanical machining (e.g. grinding) are performed, which produces the piezo stack 1. The two outer electrodes 2, 3 are then applied to the respective outer sides of the piezo stack 1, so that the two outer electrodes 2 and 3 are connected electrically to the inner electrode layers 6 and 7, respectively.

The outer electrodes 2, 3 are applied as outer metallization along the relevant outer sides of the piezo stack 1. In the process, the outer electrode 2 is connected to the inner electrode layers 7. The outer electrode 3 is connected electrically to the inner electrode layers 6. The outer electrodes 2, 3 are in each case narrower than the width of the trenches 8, 9 and extend over the trenches 8, 9 filled with the slurry 10, 11, so that the outer electrodes 2, 3 are insulated electrically from the inner electrode layers 6, 7. The depth, width and height of the trenches 8, 9 are chosen such that, in conjunction with the electrically insulating slurry 10, 11, they provide reliable electrical insulation of the inner electrodes 6 and 7 from the outer electrodes 3 and 2.

If the outer surfaces in which the trenches have been produced are provided with the passivation layer, said outer surfaces are subjected to prior mechanical machining (e.g. grinding), in order to expose the inner electrode layers 6, 7 adjoining the relevant outer side. Only then is the production of the outer electrodes 2, 3 performed.

The ceramic of the green stack 1', i.e. the green films 4' and 5', is compacted during sintering at lower temperatures than the ceramic particles in the slurry in the trenches 8, 9. This is due firstly to the fact that the green stack 1' has already been pre-compacted by the lamination of the green films 4', 5' layered one above another and therefore has a higher green density. Secondly, the silver diffusion from the electrodes consisting of AgPd promotes the compaction of the green stack 1' at lower temperatures. The different compaction behavior can lead to the formation of cracks of the slurry in the trenches and thus cause short-circuits in the finished piezo stack.

If, on the other hand, the ceramic components in the green stack 1' and in the slurry compact at approximately the same temperature, then the crack formation of the ceramic in the trenches can be avoided. In order to avoid the crack formation, the compaction behavior of the ceramic particles in the slurry is thus matched to the compaction behavior of the ceramic in the green stack 1'. This can be carried out by the addition of silver, silver oxide or lead oxide to the slurry. It is sufficient here if the agent influencing the shrinkage behavior is added in an amount from 0.05 to 1.00% by weight. Alternatively, the sintering activity of the ceramic particles can be enhanced by falling back on finer primary particle or grain sizes.

As a further alternative, subsequent compaction of the slurry in the trenches can be carried out after said slurry has been dried. To this end, for example, an isostatic pressing operation can be carried out in a liquid bath. As a result, the variants described lead to a green density of the slurry in the trenches that is better matched to the green stack 1', which means that the shrinkage behavior is matched to each other and the sintering activity is enhanced. In this connection, it may be advantageous if the introduction of the slurry into the trenches 8, 9 is carried out in a plurality of part steps, in order to obtain a flat surface of the outer sides of the stack.

Alternatively, a combination of the previously mentioned methods can also be employed in order to match the shrinkage behavior of the slurry in the trenches to the shrinkage behavior of the green stack.

What is claimed is:

1. A method for producing a piezo actuator with a piezo stack and two outer electrodes arranged on the outer side of the piezo stack, the method comprising:
   providing a fully active green stack comprising a plurality of alternately successive green films and continuous inner electrode layers,
   forming trenches in an outer side of the fully active green stack in areas in which the inner electrode layers are configured to be insulated electrically from the corresponding outer electrodes, such that the trenches shorten the inner electrode layers in these areas from the outer side of the green stack toward the inside, wherein the trenches are formed in the fully active green stack by hot embossing,
   filling the trenches with an electrically insulating slurry,
   further processing the green stack such that the green films become piezo-electric layers and the green stack becomes the piezo stack, and
   applying the two outer electrodes to the outer side of the piezo stack such that the two outer electrodes are alternately connected electrically to the inner electrode layers, such that each inner electrode layer is electrically connected to one of the outer electrodes and electrically insulated from the other outer electrode,
   wherein the trenches are filled with the slurry using one of the following methods: screen printing, immersion, spraying, and vacuum infiltration.

2. The method of claim 1, wherein in addition to filling the trenches with the slurry, the surface of the piezo stack is covered with the slurry in order to form a passivation layer with the slurry.

3. The method of claim 2, wherein the filling of the trenches and the application of the passivation layer to the surface of the piezo stack with the slurry are performed in a common processing step.

4. The method of claim 1, wherein a stamp having a number and arrangement of protrusions corresponding to a number and arrangement of the trenches is used for the hot embossing.

5. The method of claim 1, wherein a compaction behavior of ceramic particles in the slurry is matched to a compaction behavior of the piezo stack.

6. The method of claim 5, wherein an agent influencing the shrinkage behavior of the slurry is added to the slurry during a thermal treatment.

7. The method of claim 6, wherein Ag, AgO or PbO is used as the agent influencing the shrinkage behavior of the slurry.

8. The method of claim 6, wherein the agent influencing the shrinkage behavior of the slurry forms 0.05 to 1.00% by weight of the slurry.

9. The method of claim 5, wherein the sintering activity of the ceramic particles in the slurry is enhanced by a reduction in the grain or primary particle sizes.

10. The method of claim 5, wherein the green stack, is placed under pressure in a liquid bath in order to compress the slurry in the trenches.

11. The method of claim 1, wherein the filling of the trenches with the slurry is performed in multiple steps.

12. A method for producing a piezo actuator with a piezo stack and two outer electrodes arranged on the outer side of the piezo stack, the method comprising:
   providing a fully active green stack comprising a plurality of alternately successive green films and continuous inner electrode layers,
   forming trenches in an outer side of the fully active green stack in areas in which the inner electrode layers are configured to be insulated electrically from the corresponding outer electrodes, such that the trenches shorten the inner electrode layers in these areas from the outer side of the green stack toward the inside,
   filling the trenches with an electrically insulating slurry, wherein an agent influencing a shrinkage behavior of the slurry is added to the slurry during a thermal treatment, such that a shrinkage behavior of the slurry is matched to a shrinkage behavior of the piezo stack,
   further processing the green stack such that the green films become piezo-electric layers and the green stack becomes the piezo stack, and
   applying the two outer electrodes to the outer side of the piezo stack such that the two outer electrodes are alternately connected electrically to the inner electrode layers, such that each inner electrode layer is electrically connected to one of the outer electrodes and electrically insulated from the other outer electrode.

13. The method of claim 12, wherein the agent influencing the shrinkage behavior of the slurry is Ag, AgO or PbO.

14. The method of claim 12, wherein the agent influencing the shrinkage behavior of the slurry forms 0.05 to 1.00% by weight of the slurry.

15. A method for producing a piezo actuator with a piezo stack and two outer electrodes arranged on the outer side of the piezo stack, the method comprising:
   providing a fully active green stack comprising a plurality of alternately successive green films and continuous inner electrode layers,
   forming trenches in an outer side of the fully active green stack in areas in which the inner electrode layers are configured to be insulated electrically from the corresponding outer electrodes, such that the trenches shorten the inner electrode layers in these areas from the outer side of the green stack toward the inside,
   filling the trenches with an electrically insulating slurry,
   placing the green stack under pressure in a liquid bath to compress the slurry in the trenches, such that a compaction behavior of the slurry is matched to a compaction behavior of the piezo stack,
   further processing the green stack such that the green films become piezo-electric layers and the green stack becomes the piezo stack, and
   applying the two outer electrodes to the outer side of the piezo stack such that the two outer electrodes are alternately connected electrically to the inner electrode layers, such that each inner electrode layer is electrically connected to one of the outer electrodes and electrically insulated from the other outer electrode.

\* \* \* \* \*